(12) United States Patent
Sugahara et al.

(10) Patent No.: US 6,855,571 B1
(45) Date of Patent: Feb. 15, 2005

(54) METHOD OF PRODUCING GAN-BASED SEMICONDUCTOR LASER DEVICE AND SEMICONDUCTOR SUBSTRATE USED THEREFOR

(75) Inventors: Gaku Sugahara, Nara (JP); Atsushi Yamada, Osaka (JP); Akihiko Ishibashi, Osaka-fu (JP); Toshiya Yokogawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 133 days.

(21) Appl. No.: 10/366,722

(22) Filed: Feb. 14, 2003

(51) Int. Cl.$^7$ .............................................. H01L 21/00
(52) U.S. Cl. ............................. 438/46; 438/22; 438/44; 438/47
(58) Field of Search .............................. 438/44, 22, 46, 438/47

(56) References Cited

U.S. PATENT DOCUMENTS

| | | | | |
|---|---|---|---|---|
| 6,015,979 A | * | 1/2000 | Sugiura et al. | 257/86 |
| 6,627,521 B2 | * | 9/2003 | Furukawa et al. | 438/481 |
| 6,720,196 B2 | * | 4/2004 | Kunisato et al. | 438/22 |

FOREIGN PATENT DOCUMENTS

JP          11-103135          4/1999

* cited by examiner

*Primary Examiner*—David Nelms
*Assistant Examiner*—Quoc Hoang
(74) *Attorney, Agent, or Firm*—McDermott Will & Emery LLP

(57) ABSTRACT

The present invention provides a method for fabricating a GaN-based semiconductor laser device comprising the steps of forming a GaN-based semiconductor layer 102 on a substrate 101; forming, on the surface of the first GaN-based semiconductor layer, a mask layer 103 that comprises a striped pattern composed of a plurality of band-like portions 103a that are regularly arranged in the width direction and an alignment pattern formed by altering the regularity of some portion of the plurality of band-like portions 103a; depositing a second GaN-based semiconductor layer 104 on the mask layer 103 by the selective lateral growth method with starting points at portions of the first GaN-based semiconductor layer 104 that are exposed from the mask layer 103; forming a multi-layered semiconductor that comprises an n-type GaN-based semiconductor layers 105 to 107, an active layer 108, and a p-type GaN-based semiconductor layers 109 to 111 on the second GaN-based semiconductor layer 104; and forming a current injection region 112 directly above the band-like portion 103a while using the alignment pattern as a reference to position the current injection region.

5 Claims, 6 Drawing Sheets

Fig. 3
(a)
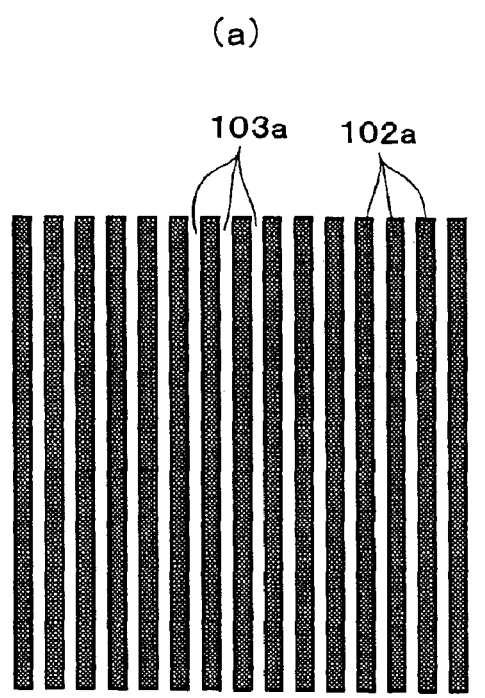
(b)
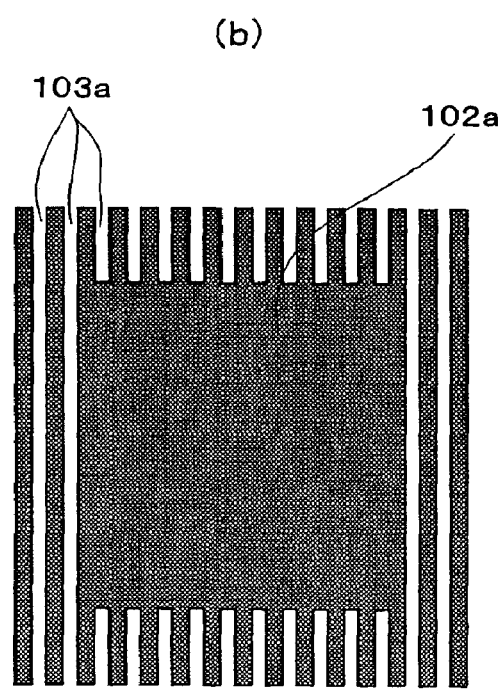

Fig. 4
(a)
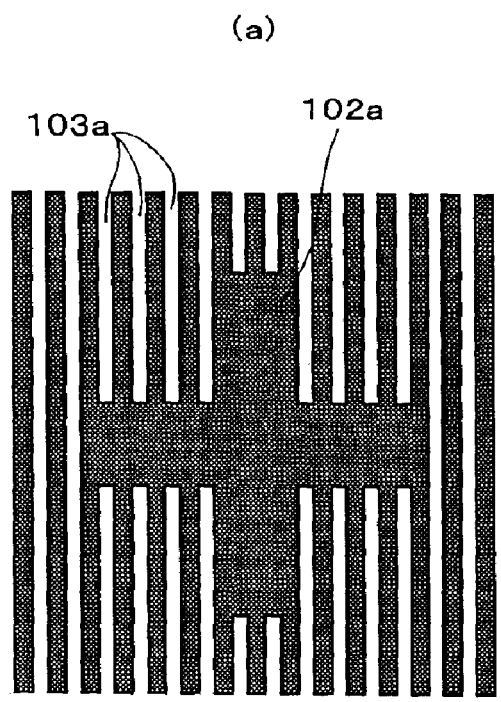
(b)
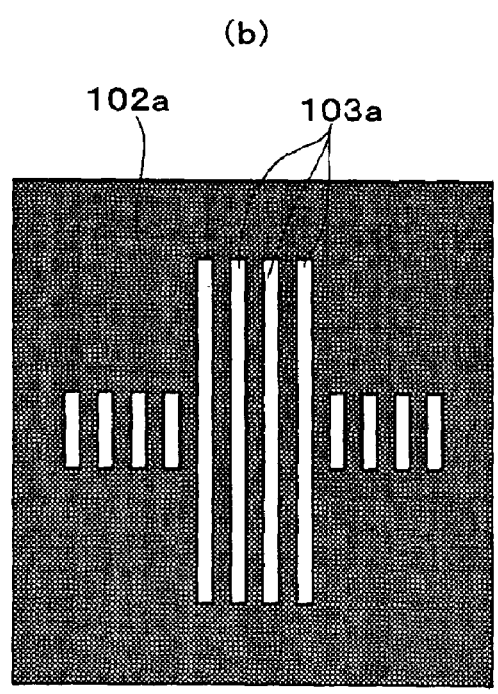

Fig. 5
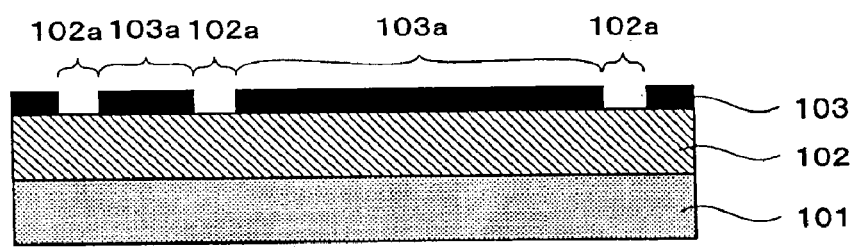
(a)
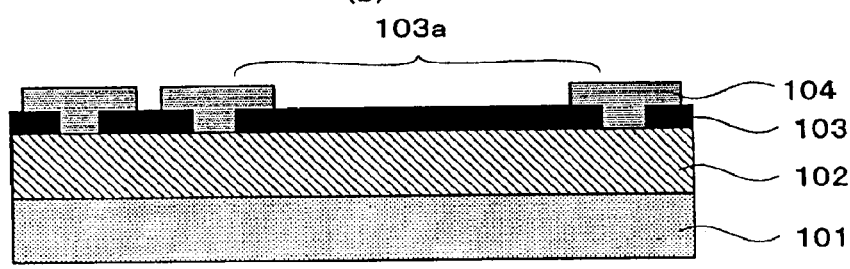
(b)
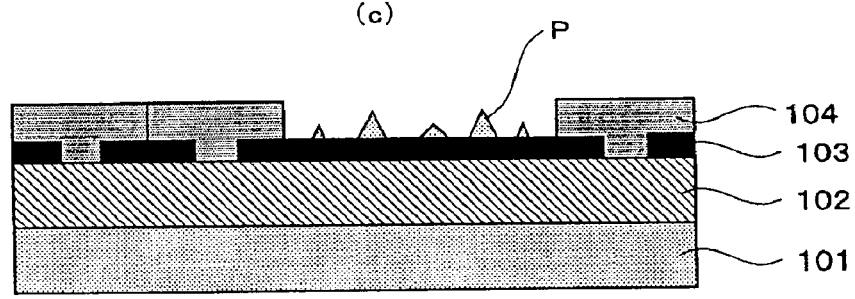
(c)
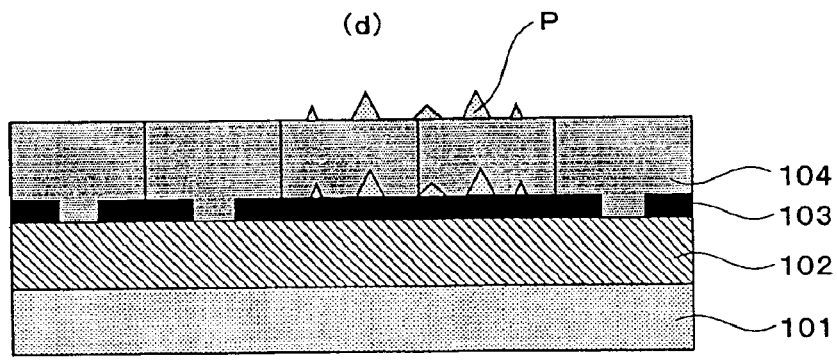
(d)

Fig. 6
(a)
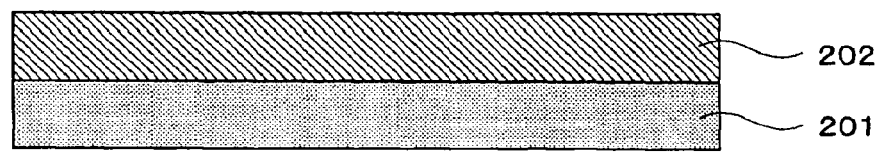
(b)
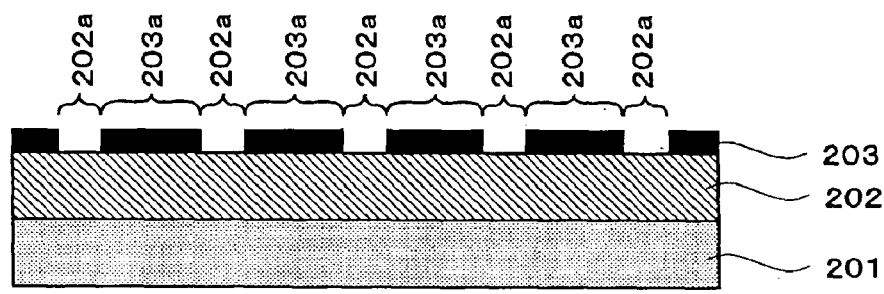
(c)
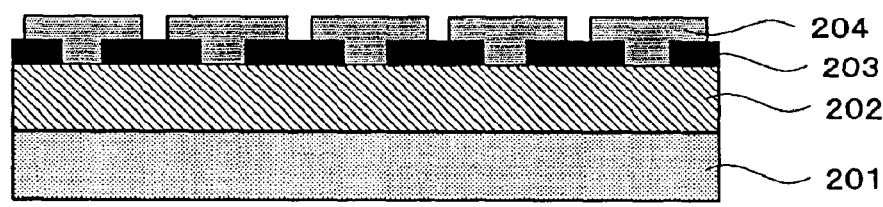
(d)
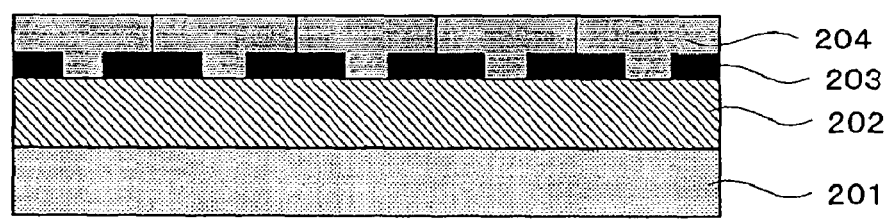

METHOD OF PRODUCING GAN-BASED SEMICONDUCTOR LASER DEVICE AND SEMICONDUCTOR SUBSTRATE USED THEREFOR

TECHNICAL FIELD

The present invention relates to a method for fabricating a gallium nitride-based compound semiconductor laser device, which can be applied to the field of optical information processing, and a semiconductor substrate used therein.

BACKGROUND ART

III–V nitride compound semiconductors are excellent candidates as useful materials for short-wavelength light emitting devices because of their wide band gap. Among these, extensive research has been conducted relating to gallium nitride-based compound semiconductors (GaN based semiconductors: AlGaInN). As a result, blue light emitting diodes (LED) and green LEDs have already been put to practical use. Furthermore, in order to increase the storage capacity of an optical disk apparatus, a semiconductor laser with its oscillation wavelength in the 400-nm band is in strong demand. For this reason, semiconductor lasers using GaN based semiconductors have attracted widespread attention, and are now approaching a level of practically use.

Because it is difficult to form bulk single crystals with a large area for GaN-based semiconductors, the crystals are generally grown on a sapphire or SiC substrate. However, since there are lattices mismatches between GaN and both of these substrates, it is difficult to achieve coherent crystal growth. Therefore, in the thus obtained GaN-based semiconductor layers, a great number of dislocations (edge dislocations, screw dislocations, mixed dislocations) exist, which significantly decrease the reliability of the semiconductor laser. For example, when a GaN-based semiconductor crystal is grown on a sapphire substrate, approximately $1 \times 10^9$ cm$^{-2}$ dislocations exist in the semiconductor layer.

A method that employs a selective lateral growth technique is thus proposed for decreasing the number of dislocations. This method is effectively used in systems having a large lattice mismatch and can reduce threading dislocations. Hereunder, a method for forming a GaN-based semiconductor layer by the ELOG (Epitaxial Lateral Overgrowth) technique, which is one of the approaches employing the selective lateral growth technique, will be explained. FIG. 6 shows a method for forming a substrate having a reduced number of dislocations in which the ELOG technique is employed.

First, employing MOVPE or a like crystal growing method, the first GaN layer 202 is formed on a sapphire substrate 201 (FIG. 6(a)).

Then, an SiO$_2$ layer is deposited by a plasma CVD method or the like and the SiO$_2$ layer is processed by photolithography and etching to form a mask layer 203 made of SiO$_2$ film. This mask layer 203 is composed of a plurality of band-like portions 203a that have a width of approximately 12 lm and are arranged with intervals therebetween of approximately 3 im. The portions of the first GaN layer 202 that are exposed by the intervals between the band-like portions 203a become seed crystal portions 202a on which a second GaN layer 204, which is described later, is deposited (FIG. 6(b)).

Then, a GaN layer is selectively grown from the seed crystal portions 202a. Here, rather than directly depositing the GaN layer on the mask layer 203, the GaN layer that is deposited on the seed crystal portions 202a laterally grows so as to cover the mask layer 203 (FIG. 6(c)).

Thereby, the mask layer 203 is entirely covered with the GaN layer, covering the entire surface of the substrate with the second GaN layer 204 (FIG. 6(d)).

In the thus structured substrate, the dislocation density of the part of the second GaN layer 204 deposited on the seed crystal portions 202a is high, at approximately $1 \times 10^9$ cm$^{-2}$, while the dislocation density of the part of the second GaN layer 204 deposited by lateral growth on the mask layer 203 is low, at approximately $1 \times 10^7$ cm$^{-2}$. Therefore, for example, when a semiconductor laser is fabricated, a current injection region is formed directly above the low-dislocation-density mask layer 203, enhancing the reliability of the semiconductor laser.

However, in the thus formed substrate, the band-like portions 203a of the mask layer 203 and the seed crystal portions 202a are alternately formed in a regular pattern. This makes it difficult to distinguish between the regions with high and low dislocation density, when forming the above-mentioned current injection region, which in turn makes it difficult to select the appropriate location for forming the current injection region. For this reason, in heretofore-used methods, a reference point called an alignment mark was formed on a layer other than the second GaN layer 204, and the location for forming the current injection region was selected by referring to the alignment mark.

However, in the above case, the additional process for forming the alignment mark makes the fabrication process complicated and the fabrication time longer.

The present invention aims to solve the above problems with a method for fabricating a GaN-based semiconductor laser device in which the current injection region can be positioned while using the heretofore-employed fabricating process without an additional process, and to provide a semiconductor substrate for use therein.

DISCLOSURE OF THE INVENTION

The first method for fabricating a GaN-based semiconductor laser device of the present invention that achieves the above objects comprises the steps of forming a first GaN-based semiconductor layer on a substrate; forming, on the surface of the first GaN-based semiconductor layer, a mask layer that comprises a striped pattern composed of a plurality of band-like portions that are regularly arranged in the width direction and an alignment pattern formed by altering the regularity of a portion of the plurality of band-like portions; depositing a second GaN-based semiconductor layer on the mask layer by the selective lateral growth method with starting points at portions of the first GaN-based semiconductor layer that are exposed from the mask layer; forming a multi-layered semiconductor that comprises an n-type GaN-based semiconductor layer, an active layer, and a p-type GaN-based semiconductor layer on the second GaN-based semiconductor layer; and forming a current injection region directly above the band-like portion while using the alignment pattern as a reference to position the current injection region.

The substrate for a GaN-based semiconductor device according to the second embodiment of the present invention, which also achieves the above objects, comprises a substrate; a first GaN-based semiconductor layer that is formed on the substrate; a mask layer comprising a striped pattern that is formed on the first GaN-based semiconductor layer and composed of a plurality of band-like portions that are regularly arranged, and an alignment pattern that is formed by altering the regularity of some of the plurality of band-like portions; and a second GaN-based semiconductor layer that is deposited on the mask layer with portions of the first GaN-based semiconductor layer that are exposed from the mask layer as starting points.

BRIEF DESCRIPTION OF DRAWINGS

FIG. 3 is a diagram showing a mask layer used in the method for fabricating a GaN-based semiconductor laser device as shown in FIG. 1, in which FIG. 3(a) is an enlarged diagram showing the main part of a striped pattern and FIG. 3(b) is an enlarged diagram showing the main part of an alignment pattern.

FIG. 4 is an enlarged diagram showing the main part of another alignment pattern that is used in the method for fabricating the GaN-based semiconductor laser device of the present invention.

FIG. 5 is a diagram showing examples of the widths of the band-like portions on the mask layer.

FIG. 6 is a diagram showing a known method for fabricating a GaN-based semiconductor laser device.

BEST MODE FOR CARRYING OUT THE INVENTION

Figure 1:
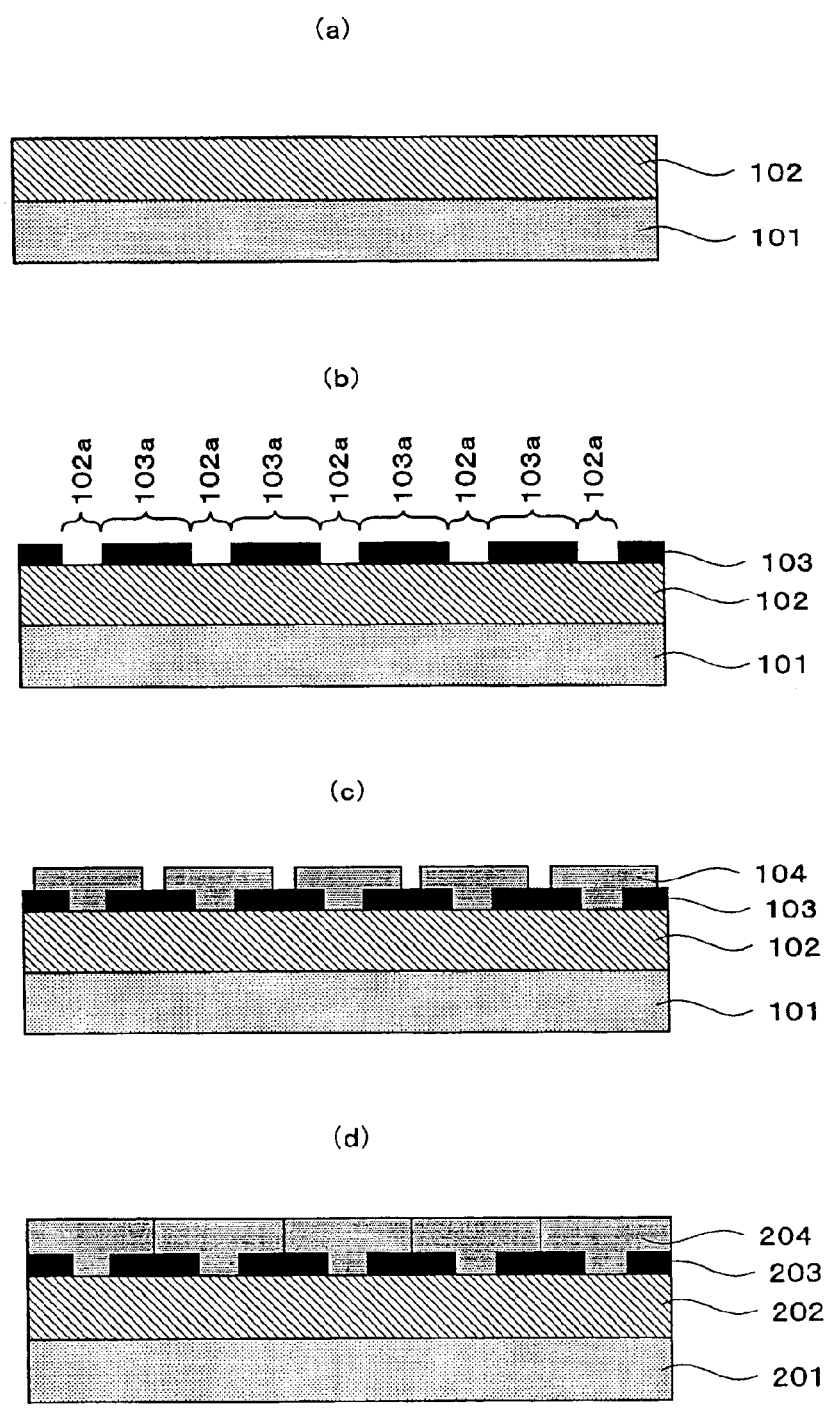
FIG. 1 is a diagram showing a method for fabricating a GaN-based semiconductor laser device according to one embodiment of the present invention.
Figure 2:
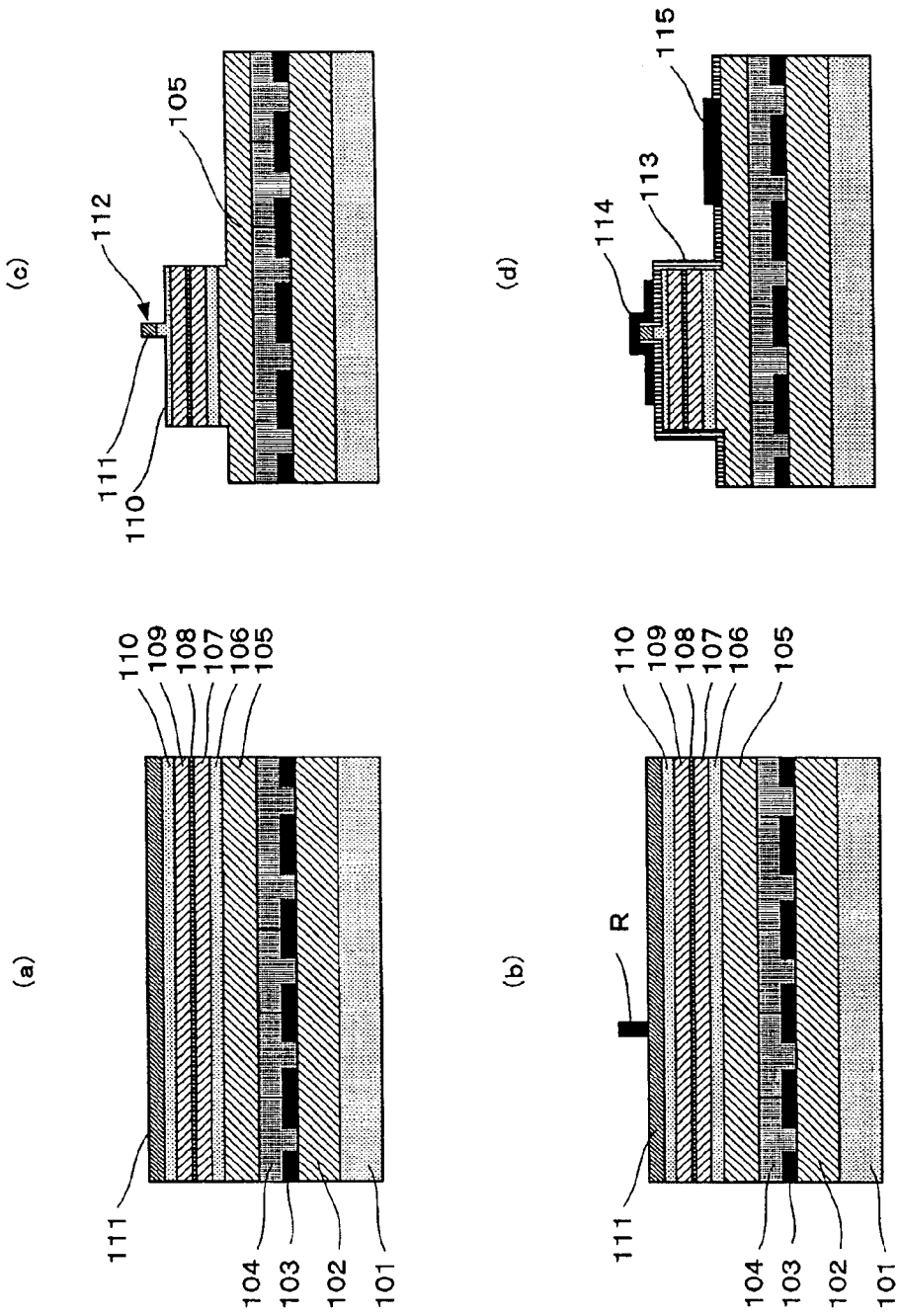
FIG. 2 is a diagram showing a method for fabricating a GaN-based semiconductor laser device according to one embodiment of the present invention.

Hereunder, a method for fabricating a GaN-based semiconductor laser device according to one embodiment of the present invention will be explained with reference to the drawings. FIGS. 1 and 2 show a method for fabricating a semiconductor laser device according to the present embodiment. Note that, in this embodiment, an example is described in which a substrate is formed by selective lateral growth employing the ELOG method.

As shown in FIG. 1(a), the MOVPE method is used to deposit a GaN buffer layer (not shown) on a sapphire substrate 101 by supplying trimethylgallium (TMG) and ammonia ($NH_3$) at a substrate temperature of 500° C. Thereafter, the substrate temperature is raised to 1,020° C., and a GaN layer (the first GaN layer) 102 is deposited by supplying THG and $NH_3$.

Next, by employing a plasma CVD method with, for example, silane ($SiH_4$) and $N_2O$ as source materials, a silicon oxide film ($SiO_2$) layer is deposited on the entire surface of the substrate. It is also possible to form the $SiO_2$ layer by sputtering. Then, resist is applied to the entire surface of the substrate, and the resist is patterned into a predetermined shape by photolithography. Based on this resist pattern, a mask layer 103 made of $SiO_2$ is formed on the substrate. This mask layer 103 comprises a striped pattern with a plurality of regularly aligned band-like portions 103a as shown in FIG. 3(a) and an alignment pattern (a pattern for positioning use) as shown in FIG. 3(b). The striped pattern is structured so that band-like portions 103a all having substantially the same width are aligned in the lateral direction with predetermined intervals therebetween. This pattern is used to make the GaN-based semiconductor layer grow selectively in the lateral direction. At least one alignment pattern is provided somewhere in the striped pattern and used for positioning the current injection region, which is described later.

The thus formed resist pattern serves as an etching mask and, for example, a reactive ion etching technique using carbon tetrafluoride ($CF_4$) is used to etch portions of the mask layer 103. Then, after exposing portions of the GaN layer 102, the resist is removed. The thus formed GaN layer 102a that is exposed from the mask layer 103 becomes seed crystal portions 102a, which serve as starting points for the GaN layer to be deposited by the selective lateral growth method.

As shown in FIG. 3(b), the alignment pattern formed on the mask layer 103 comprises rectangular seed crystal portions 102a formed by removing portions of the regularly arranged band-like portions 103a. In this way, the alignment pattern is formed by changing the regularity of the regularly arranged band-like portions 103a by altering some portion of the alignment. Thereby, a reference point for alignment is formed in the regularly arranged striped pattern. Note that the shape of the alignment pattern is not limited to this, and as long as it is structured so as to alter the regularity of the band-like portions 103a, it can be formed into various shapes. It is also possible to obtain an alignment pattern, for example, by making the widths of some band-like portions 103a wider or narrower than those of others. Alternatively, as shown in FIG. 4(a), it is also possible to obtain an alignment pattern by removing the band-like portions 103a in such a manner as to form a cross shape for forming a cross-shaped seed crystal portion 102a. Furthermore, as shown in FIG. 4(b), it is also possible to obtain an alignment pattern by forming a comparatively wide region in which the GaN layer 102 is exposed and arranging the band-like portions 103a in such a manner that a cross shape is formed in this region. Other than these examples, the alignment pattern can be formed into various shapes, such as a circle and the like.

The explanation of the fabrication method will now continue by referring backing to FIG. 1. As described above, after the mask layer 103 portions are formed, the MOVPE method is used to selectively deposit the GaN layer 104 (the second GaN layer), with the seed crystal portions 102a as the starting points, by supplying TMG and $NH_3$ at a temperature of approximately 1,000° C. and a pressure of approximately 200 Torr. At this time, most of the GaN layer 104 is not deposited directly onto each mask layer 103 portion. As shown in FIG. 1(c), the mask layer 103 portions are covered as the GaN layer grows in the lateral directions with the seed crystal portions 102a as the starting points. As a result, as shown in FIG. 1(d), after sufficient time passes, the entire surface of the substrate is covered with the GaN layer 104. Here, the GaN layer grown on the mask layer 103 portions by the lateral growth technique has a low density of dislocations, and a current injection region is formed directly above thereof. The substrate for a semiconductor laser device is formed by following the above processes.

Note that, when a substrate having the above-described structure is formed, it is preferable that the band-like portions 103a have a width of not less than 0.1 im considering the characteristics of photolithography. At the same time, it is preferable that the width of the band-like portions 103a be no greater than 100 im. The reason for this is as follows. As shown in FIG. 5, for example, when an alignment pattern is formed by making some of the band-like portions 103a wider than others, if a portion is too wide, polycrystals P may be deposited on the wide band-like portion 103a during the lateral growth of the GaN layer, as shown in FIG. 5(c). If polycrystals P are deposited as described above, the GaN layer 104, which grows laterally from the seed crystal portions 102a to the band-like portions 103a, will be subjected to interference from the polycrystals P. As shown in FIG. 5(d), this will degrade the film property of the GaN layer 104 in the areas of interference, or possibly distort the shape of the alignment pattern because a flat surface cannot be obtained. From such a viewpoint, it is preferable that the width of the band-like portions 103a be no greater than 50 im and more preferably no greater than 35 im.

It is preferable that the band-like portions 103a in the striped pattern have intervals therebetween of not less than 0.1 im considering the characteristics of photolithography. Furthermore, it is preferable that the upper limit of the interval be not greater than 10 in, from the viewpoint to make the region where a great number of dislocations exist as narrow as possible.

A semiconductor laser device is then fabricated using a substrate having such a structure. First, as shown in FIG. 2(a), a multi-layered semiconductor is formed on the substrate. The multi-layered semiconductor is formed by depositing an n-GaN layer 105, an n-AlGaN cladding layer 106, an n-GaN optical guide layer 107, a multi-quantum well (MQW) active layer 108 composed of GaInN/GaInN, a p-GaN optical guide layer 109, a p-AlGaN cladding layer 110, and a p-GaN contact layer 111, in this order.

Then, as shown in FIG. 2(b), on the above-described low-dislocation regions of the mask layer 103 portions, i.e., directly above the band-like portions 103a, a band-like resist pattern R having a width of approximately 2 im is formed by a photolithography technique. In this process, the resist pattern R is positioned directly above the band-like portions 103a using the alignment pattern as a reference. As described above, by using the alignment pattern, the resist pattern R can be easily positioned even in the regularly arranged band-like portions 103a.

Next, as shown in FIG. 2(c), reactive ion etching is done with a chorine-based gas and using the above-described resist pattern R as a mask, and the p-GaN contact layer 111 and p-AlGaN cladding layer 110 are partly removed.

Thereafter, the resist pattern R is removed and a ridge stripe (current injection region) 112 is formed. Then, the ridge stripe 112 and the peripheral portion thereof are masked and etching is conducted until the n-GaN layer 105 becomes exposed.

Thereafter, as shown in FIG. 2(d), an insulating film 113 made of $SiO_2$ is formed on the entire surface of the substrate. Then, the portion corresponding to the ridge stripe 112 is etched to make an opening in the insulating film 113, and a p-electrode 114 made of Ni/Au or the like is formed. Furthermore, the insulating film 113 on the n-GaN layer 105 is also etched to make an opening, and then an n-electrode 115 made of, for example, Ti/Al or the like is formed. By following the above-described procedure, a semiconductor laser device is fabricated.

The operation of a semiconductor laser device having the above-described structure will now be explained. First, when the n-electrode 115 is grounded and voltage is applied to the p-electrode 114, holes are injected from the p-electrode 114 side toward the MQW active layer 108, while electrons are injected from the n-electrode 115 side. Thereby, optical gain is generated in the MQW active layer 108 and laser oscillation having an oscillation wavelength in the 400 nm band is generated. The oscillation wavelength varies depending on the ratio and film thickness of the GaInN/GaInN thin film constituent of the MQW active layer 108.

Note that, in the semiconductor laser device that is fabricated as described above, continuous oscillation is possible at room temperature or higher. Furthermore, by controlling the width and height of the ridge stripe in this semiconductor laser device, laser oscillation becomes possible in the fundamental transverse mode in the horizontal direction. In other words, by differentiating the optical confinement factors of the fundamental transverse mode and higher order mode (the first higher order mode) and above, oscillation in the fundamental transverse mode becomes possible.

As described above, in the method for fabricating a semiconductor laser device according to the present embodiment, the mask layer 103 comprising the striped pattern with the regularly arranged band-like portions 103a and an alignment pattern for positioning obtained by altering the regularity of these band-like portions 103a is formed. Then, using this alignment pattern as a reference, the formation of the ridge stripe is positioned. In other words, in the present embodiment, the alignment pattern is formed by partly employing the heretofore-used method for forming the mask layer 103, but without having a separate step to obtain a positioning mark, which is required in known methods. Therefore, the fabrication process thereof becomes simplified and the fabrication time can be reduced.

If a substrate for a semiconductor device having an alignment pattern as shown in FIG. 1 thereon is used, when semiconductor devices other than a semiconductor laser device, such as light emitting diodes, transistors, and the like, are fabricated, there is no need for a separate process to form an alignment mark. This makes it possible to simplify the fabrication process and reduce the fabrication time.

Hereabove, one embodiment of the present invention was explained; however, the present invention is not limited to this, and as long as they do not depart from the spirit and the scope of the invention, various modifications can be made. For example, in the above embodiment, an example wherein ELOG is employed was explained; however, ABLEG or PENDEO can also be employed.

What is claimed is:

1. A method for fabricating a GaN-based semiconductor laser device comprising the steps of:

forming a first GaN-based semiconductor layer on a substrate;

forming, on the surface of the first GaN-based semiconductor layer, a mask layer that comprises a striped pattern composed of a plurality of band-like portions that are regularly arranged in the width direction and an alignment pattern formed by altering the regularity of a portion of the plurality of band-like portions;

depositing a second GaN-based semiconductor layer on the mask layer by the selective lateral growth method with starting points at portions of the first GaN-based semiconductor layer that are exposed form the mask layer;

forming a multi-layered semiconductor that comprises an n-type GaN-based semiconductor layer, an active layer, and a p-type GaN-based semiconductor layer on the second GaN-based semiconductor layer; and forming a current injection region directly above the band-like portion while using the alignment pattern as a reference to position the current injection region.

2. The method for fabricating a GaN-based semiconductor laser device according to claim 1, wherein the alignment pattern is formed by removing a portion of the regularly arranged band-like portion.

3. The method for fabricating a GaN-based semiconductor laser device according to claim 1, wherein the alignment pattern is formed by differentiating the width of one band-like portion from that of other band-like portions.

4. The method for fabricating a GaN-based semiconductor laser device according to claim 1, wherein the widths of the band-like portions are 0.1 to 100 $\mu$m.

5. The method for fabricating a GaN-based semiconductor laser device according to claim 1, wherein the intervals between the band-like portions in the striped pattern are 0.1 to 10 im.

* * * * *

UNITED STATES PATENT AND TRADEMARK OFFICE
CERTIFICATE OF CORRECTION

PATENT NO. : 6,855,571 B1  
DATED : February 15, 2005  
INVENTOR(S) : Gaku Sugahara et al.

Page 1 of 1

It is certified that error appears in the above-identified patent and that said Letters Patent is hereby corrected as shown below:

Column 1,  
Line 65, change "12lm" to -- 12 $\mu$m --  
Line 66, change "3 im" to -- 3 $\mu$m --

Column 3,  
Line 63, change "THG" to -- TMG --

Column 5,  
Line 13, change "0.1 im" to -- 0.1 $\mu$m --  
Line 16, change "100 im" to -- 100 $\mu$m --  
Lines 32-33, change "50 im" to -- 50 $\mu$m --  
Line 33, change "35 im" to -- 35 $\mu$m --  
Line 37, change "0.1 im" to -- 0.1 $\mu$m --  
Line 39, change "10 im" to -- 10 $\mu$m --  
Line 56, change "2 im" to -- 2 $\mu$m --

Column 8,  
Line 22, change "10 im" to -- 10 $\mu$m --

Signed and Sealed this

Ninth Day of August, 2005

JON W. DUDAS  
*Director of the United States Patent and Trademark Office*